United States Patent [19]

Tanigawa

[11] Patent Number: 5,471,418
[45] Date of Patent: Nov. 28, 1995

[54] SEMICONDUCTOR MEMORY WITH STACKED-CAPACITOR CELLS

[75] Inventor: Takaho Tanigawa, Tokyo, Japan

[73] Assignee: NEC Corporation, Tokyo, Japan

[21] Appl. No.: 116,675

[22] Filed: Sep. 7, 1993

[30] Foreign Application Priority Data

Sep. 7, 1992 [JP] Japan ................................. 4-237945

[51] Int. Cl.⁶ ................................................. G11C 11/24
[52] U.S. Cl. ........................ 365/149; 257/301; 257/303; 257/306
[58] Field of Search ................................. 257/301, 303, 257/306, 905, 906, 907, 908; 365/149

[56] References Cited

U.S. PATENT DOCUMENTS 5,247,196  9/1993  Kimura .................................. 257/303

FOREIGN PATENT DOCUMENTS 2-86164  3/1990  Japan .

OTHER PUBLICATIONS

T. Kaga et al, "Crown-Shaped Stacked-Capacitor Cell for 1.5-V Operation 64-Mb DRAM's", IEEE Transactions on Electron Devices, vol. 38, No. 2, Feb. 1991, pp. 255-260.

*Primary Examiner*—David C. Nelms
*Assistant Examiner*—F. Niransan
*Attorney, Agent, or Firm*—Sughrue, Mion, Zinn, Macpeak & Seas

[57] ABSTRACT

A DRAM with improved stacked-capacitor memory cells is provided. In each memory cell, an aluminum wiring line acting as a part of one of word lines is covered with a interlayer insulator film, and on the interlayer insulator film, a storage capacitor is formed. A storage electrode of the capacitor is contacted with a source/drain region of an MOS select transistor through a contact hole in the interlayer insulator film. The wiring line is not required to be formed over the capacitor and as a result, thickness of the storage electrode of the capacitor is not limited by a fabrication condition. Thus, a dielectric such as $Ta_2O_5$ with a larger dielectric constant can be employed as the capacitor dielectric, so that the memory cell area can be reduced.

13 Claims, 9 Drawing Sheets

SEMICONDUCTOR MEMORY WITH STACKED-CAPACITOR CELLS

BACKGROUND OF THE INVENTION

1. Field of the Invention

The present invention relates to a semiconductor memory and more particularly, to a Dynamic Random Access Memory (DRAM) in which each memory cell has a stacked-capacitor structure.

2. Description of the Related Art

Recently, to increase the number of memory cells placed on a semiconductor chip of a DRAM, the occupied area of each memory cell has been required to be reduced to make its capacity larger. If the storage capacitor of each memory cell is made smaller, the occupied area can be reduced, however, in the case, the capacitor has to had a sufficient capacitance for exactly reading out the storage data value in the cell. Accordingly, as a technique to enable the storage capacitance larger without increasing its memory cell area, the stacked-capacitor structure has been developed and employed. A conventional DRAM with the stacked-capacitor memory cells is disclosed, for example, in the Japanese Non-examined Patent Publication 2-86164.

A sample of a conventional DRAM memory cell of this sort is illustrated in FIG. 1, in which a patterned field oxide 42 is formed on a surface of a p-type silicon substrate 41 to make an active device area on its surface area. In the active device area, a pair of source/drain regions 45a and 45b of a metal-oxide-semiconductor (MOS) transistor are formed in the substrate 41, and a polysilicon gate electrode 44 is formed through a gate oxide 43 on the substrate 41. The pair of source/drain regions 45a and 45b are made of n-type diffusion regions, respectively. The gate electrode 44 acts as a part of one of word lines.

The exposed surfaces of the field oxide 42, the gate electrode 44 and the substrate 41 are covered with a first interlayer insulator 46. With the active device area, one of bit lines 47, which are formed on the first interlayer insulator 46 and made of refractory metal-silicide, is contacted through a contact hole of the first interlayer insulator 46 with the source/drain region 45a at a contact area 56.

A second interlayer insulator 48 is formed on the first interlayer insulator 46 with covering the bit lines 47. The polysilicon storage electrode 51 is formed on the second interlayer insulator 48. The storage electrode 51 is contacted through a contact hole penetrating the first and second interlayer insulator 46 and 48 with the source/drain region 45b at a contact area 57.

A dielectric 52, which is made of a silicon dioxide ($SiO_2$) film and a silicon nitride ($Si_3N_4$) film, is formed on the storage electrode 51 along the surface of the electrode 51, thus the entire surface of the electrode 51 is covered with the dielectric 52. The surface of the dielectric 52 and the exposed surface of the second interlayer insulator 48 are covered with a polysilicon opposite electrode 53. The polysilicon storage electrode 51, the opposite electrode 53 and the dielectric 52 constitutes a storage capacitor.

A third interlayer insulator 50 is formed on the capacitor opposite electrode 53 so as to cover the entire surface of the electrode 53, and on the third interlayer insulator 50, a wiring line 49 made of aluminum system metal is formed. The wiring line 49 constitutes a part of one of word lines together with the gate electrode 44.

In the above-described DRAM memory cell, to reduce the cell area and to ensure sufficient capacitance of the storage capacitor for normal operation, the thickness of the storage electrode 51 is required to be increased thereby to enlarge its surface area, or any material with a larger dielectric constant $\epsilon$ such as tantalum oxide ($Ta_2O_5$), lead zirconate titanate (PZT) or the like is required to be employed as the dielectric 52.

However, if the thickness of the storage electrode 51 is increased, there arises the following problem: Since there arises a large difference in level between the memory cell area containing the storage capacitor and a peripheral circuit area of the DRAM, their optimum focal points become badly different from each other in the process of forming the wiring lines 49 by photolithography and etching techniques. If the difference in level is beyond the given focusing margins of the stepping projection aligner or stepper and the photoresist film used in the process, the configuration or shape of the photoresist film after patterning deteriorates and as a result, disconnection and/or short-circuit in the wiring lines 49 becomes easy to occur.

In addition, when metal oxide is used as the dielectric 52, the process temperature has to be kept at or under a given temperature such as 600° C. during the process for forming the storage capacitor and subsequent processes in order to prevent the dielectric constant reduction of the metal oxide due to a chemical reaction between the metal oxide and the storage electrode material and/or oxidation of the storage electrode material. However, with the conventional memory cell, in order to facilitate formation of the wiring lines 49, the second interlayer insulator 48 made of boron-doped phosphosilicate glass (BPSG) is deposited on the first interlayer insulator 46 and thereafter, its heat treatment is required to be carried out at a high temperature such as 800° to 900° C. to reflow the BPSG film 48 for its planarization. Therefore, there is another problem that it is difficult to employ metal oxide as the dielectric 52.

SUMMARY OF THE INVENTION

Accordingly, an object of the present invention is to provide a semiconductor memory with stacked-capacitor cells in which the memory cell area can be reduced.

Another object of the present invention is to provide a semiconductor memory with stacked-capacitor cells in which the capacitance of the storage capacitor per unit area can be increased.

A semiconductor memory according to a first aspect of the present invention contains an array of memory cells each of which has an MOS select transistor and a storage capacitor. The MOS select transistor is formed on a semiconductor substrate and is covered with a first interlayer insulator. Bit lines are placed on the first interlayer insulator and one of the bit lines is contacted with one of a pair of source/drain regions of the transistor. The bit lines are covered with a second interlayer insulator.

A first wiring line, which acts as a part of one of word lines, is formed on the second interlayer insulator, and a third interlayer insulator is formed on the second interlayer insulator with covering the wiring line.

A first capacitor electrode constituting a storage capacitor is formed on the third interlayer insulator, and is contacted with the other of the pair of source/drain regions through a contact hole penetrating the first, second and third interlayer insulators. A capacitor dielectric constituting the storage capacitor is formed on the first storage electrode with covering an entire surface of the capacitor electrode. A second capacitor electrode constituting the storage capacitor is formed on the capacitor dielectric with covering an entire surface of the dielectric.

With the semiconductor memory according to the first aspect, the first wiring line is formed on the second interlayer insulator, and the storage capacitor is formed above the wiring line through the third interlayer insulator, so that the wiring line is not required to be formed over the capacitor and as a result, thickness of the first capacitor electrode is not limited by the given focusing margins of a stepping projection aligner or stepper and a photoresist film used in the process for forming the wiring line. Thus, if a dielectric such as Ta2O5 with a larger dielectric constant is employed as the capacitor dielectric and the capacitance value of the storage capacitor is made the same as the conventional one, the memory cell area can be made reduced. In other words, the capacitance value of the storage capacitor per unit area can be increased.

A semiconductor memory according to a second aspect of the present invention contains an array of memory cells each of which has an MOS select transistor and a storage capacitor. One of a pair of source/drain regions of the transistor is electrically connected to one of bit lines and the other of the pair of source/drain regions is electrically connected to a first electrode of the storage capacitor. A second electrode and a dielectric between the first and second electrodes are stacked on the first electrode.

One of first wiring lines acting as parts of respective word lines is formed over the bit line through a first interlayer insulator, and the storage capacitor is placed over the first wiring line through a second interlayer insulator.

With the semiconductor memory of the second aspect, the same effects as those in the first aspect can be obtained.

In the semiconductor memory of the first and second aspects, a second wiring line acting as a selection line of a column decoder may be provided between the first wiring line and the capacitor storage electrode.

Preferably, the storage electrode is made of amorphous silicon or tungsten, and the capacitor dielectric is made of metal oxide.

DETAILED DESCRIPTION OF THE PREFERRED EMBODIMENTS

Preferred embodiments of the present invention will be described below referring to FIGS. 2 to 10.

First Embodiment

Figure 2:
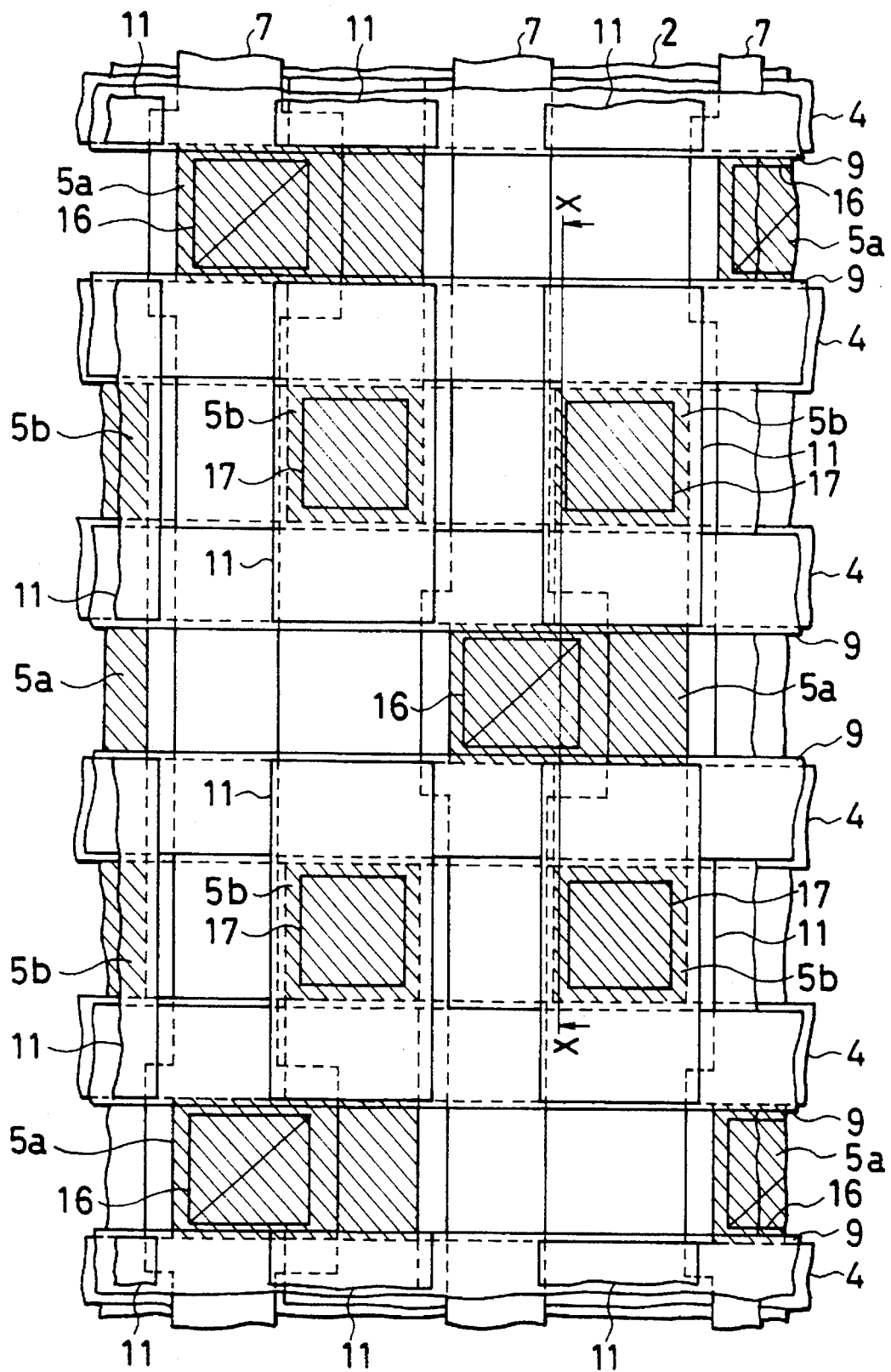
FIG. 2 shows a layout of memory cells of a semiconductor memory according to a first embodiment of the present invention.
Figure 3:
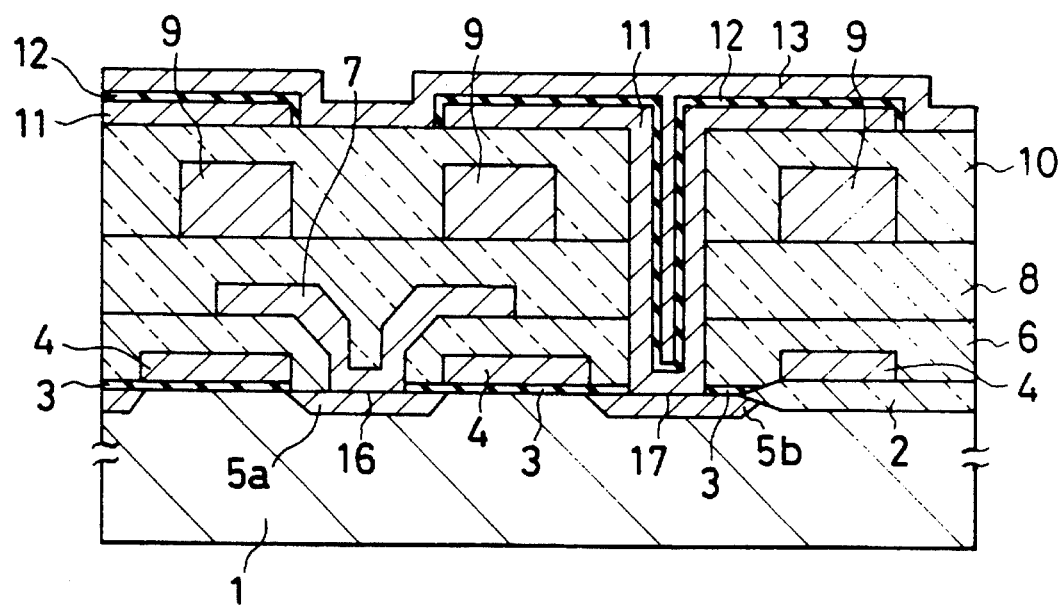
FIG. 3 shows a cross-section along the line X—X in FIG. 2.

As shown in FIGS. 2 and 3, a DRAM of a first embodiment of the present invention contains an array of memory cells arranged on a p-type silicon substrate 1. In each memory cell, a patterned field oxide 2 is formed on the surface of the substrate 1 to make an active device area on its surface area. In the active device area, a pair of source/drain regions 5a and 5b of an MOS select transistor are formed in the substrate 1, and a polysilicon gate electrode 4 is formed through a gate oxide 3 on the substrate 1. The source/drain regions 5a and 5b are made of n-type diffusion regions, respectively. The gate electrode 4 acts as a part of one of word lines.

The exposed surfaces of the field oxide 2, the gate electrode 4 and the substrate 1 are covered with a first interlayer insulator 6. The first interlayer insulator 6 is made of BPSG or $SiO_2$. One of bit lines 7, which are formed on the first interlayer insulator 6 and made of refractory metal-silicide, is electrically connected through a contact hole in the first interlayer insulator 6 to the source/drain region 5a at a contact area 16.

A second interlayer insulator 8 is formed on the first interlayer insulator 6 with covering the bit lines 7. On the second interlayer insulator 8, a first wiring line 9 made of aluminum system metal is formed just above the gate electrode 4. The first wiring line 9 constitute a part of one of word lines together with the gate electrode 4.

A third interlayer insulator 10 is formed on the second interlayer insulator 8 with covering the first wiring line 9. A polysilicon storage electrode 11 of a storage capacitor is formed on the third interlayer insulator 10 just above the source/drain region 5b. The storage electrode 11, which is made of an amorphous silicon or tungsten film whose thickness is 300 to 3000 nm, is contacted at a contact area 17 with the source/drain region 5b through a contact hole penetrating the first, second and third interlayer insulators 6, 8 and 10.

A dielectric 12 of the storage capacitor is formed on the storage electrode 11 along its surface, thus the entire surface of the electrode 11 is covered with the dielectric 12. The dielectric 12 may be made of an $SiO_2$ film, however, it may have a two-layer structure composed of a silicon dioxide film and an $Si_3N_4$ film. Further, the dielectric 12 may have a three-layer structure containing silicon dioxide and silicon nitride films.

Preferably, the dielectric 12 is made of a metal oxide film such as $Ta_2O_5$, PZT or the like because of their large dielectric constant values.

The surface of the dielectric 12 and the exposed surface of the third interlayer insulator 10 are covered with an opposite electrode 13 of the storage capacitor. The opposite electrode 13, which is not shown in FIG. 2 for simplification of illustration, is made of a polysilicon film or a refractory metal film such as tungsten (W) or titanium nitride (Ti-N) film.

Next, a fabrication method of the above-described DRAM is shown below referring to FIGS. 4 to 8.

Figure 4:
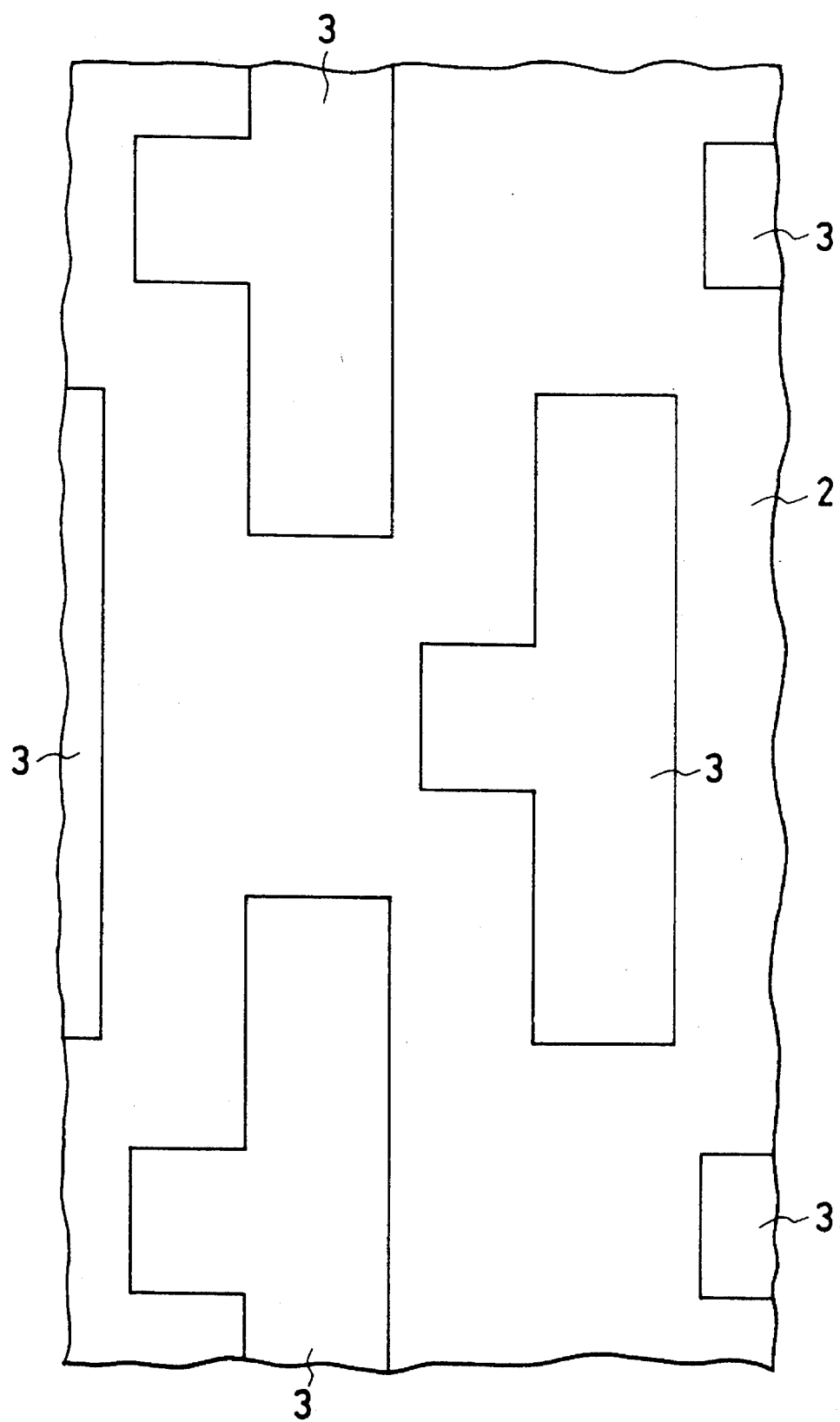
FIGS. 4 to 7 are layout diagram for showing a fabrication sequence of the semiconductor memory shown in FIG. 2, respectively.

First, as shown in FIG. 4, the field oxide 2 is selectively deposited on the surface of the substrate 1 thereby to make the active device areas in the respective memory cells, and thereafter, the gate oxide 3 is formed on the respective active device areas.

Figure 5:
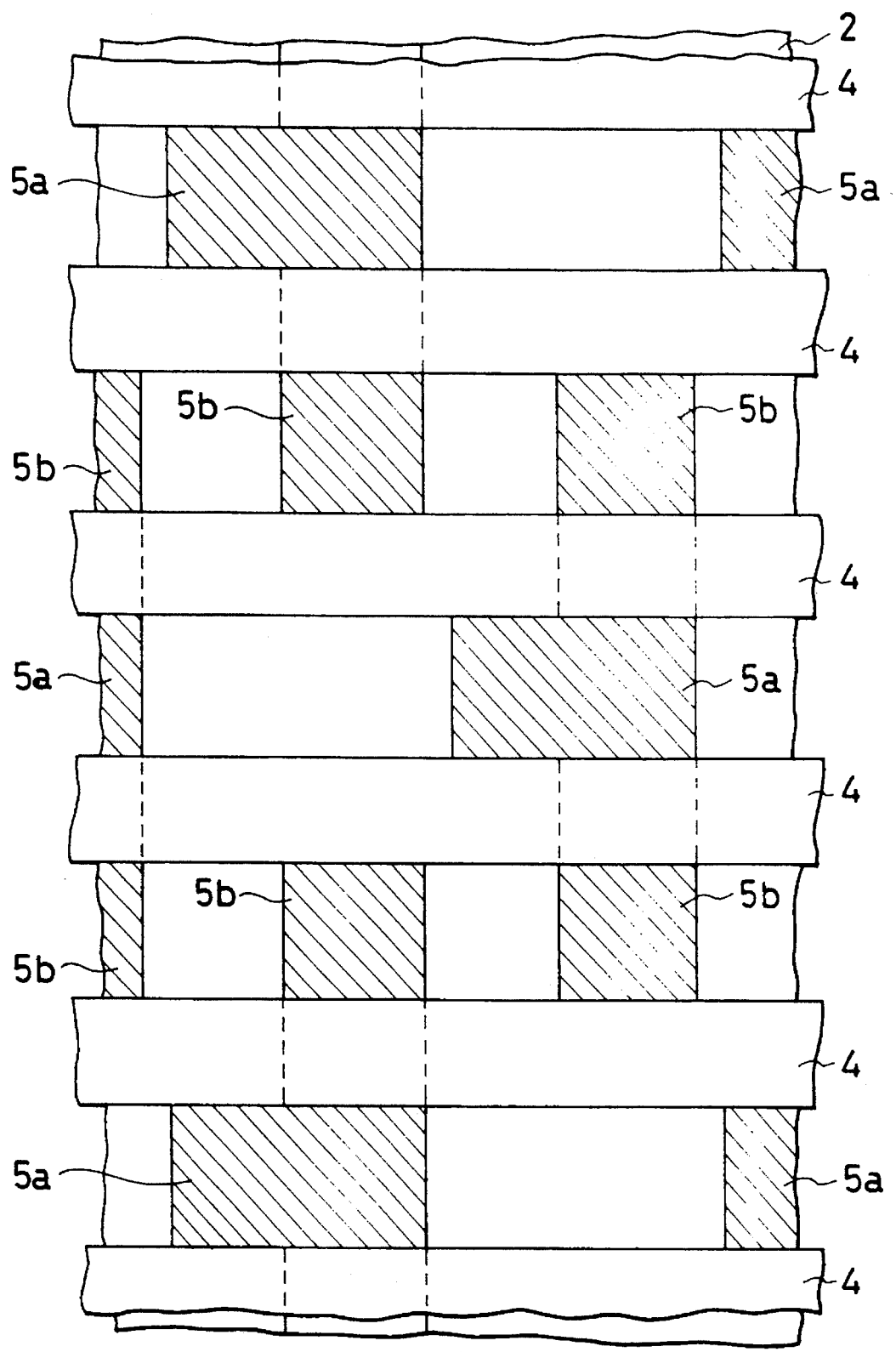

Then, as shown in FIG. 5, the gate electrodes 4 are formed on the gate oxides 3 in the respective active device areas. An n-type impurity is selectively doped into the p-type substrate 1 to form the pairs of source/drain regions 5a and 5b. The first interlayer insulator 6 is deposited on the substrate 1 and patterned so as to cover the pairs of source/drain regions 5a and 5b and the gate electrodes 4 by a chemical vapor deposition (CVD) technique.

Figure 6:
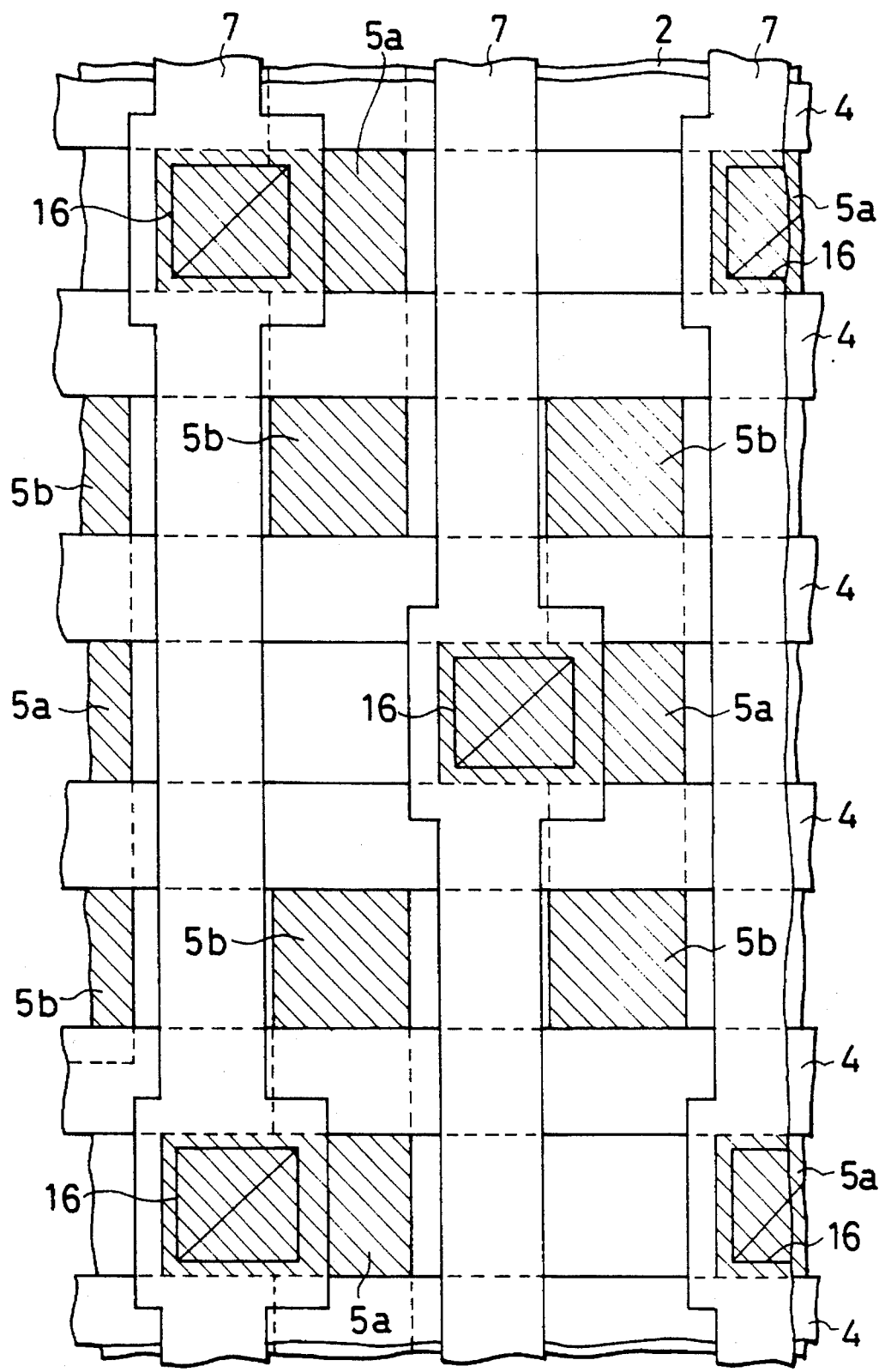

At the positions just above the respective source/drain regions 5a and 5b, as shown in FIG. 6, the contact holes for the respective bit lines 7 and those for the respective storage capacitors are formed in the first interlayer insulator 6. A tungsten silicide layer is deposited on the first interlayer insulator 6 by a sputtering technique and patterned by an etching technique to form the bit lines 7.

Figure 7:
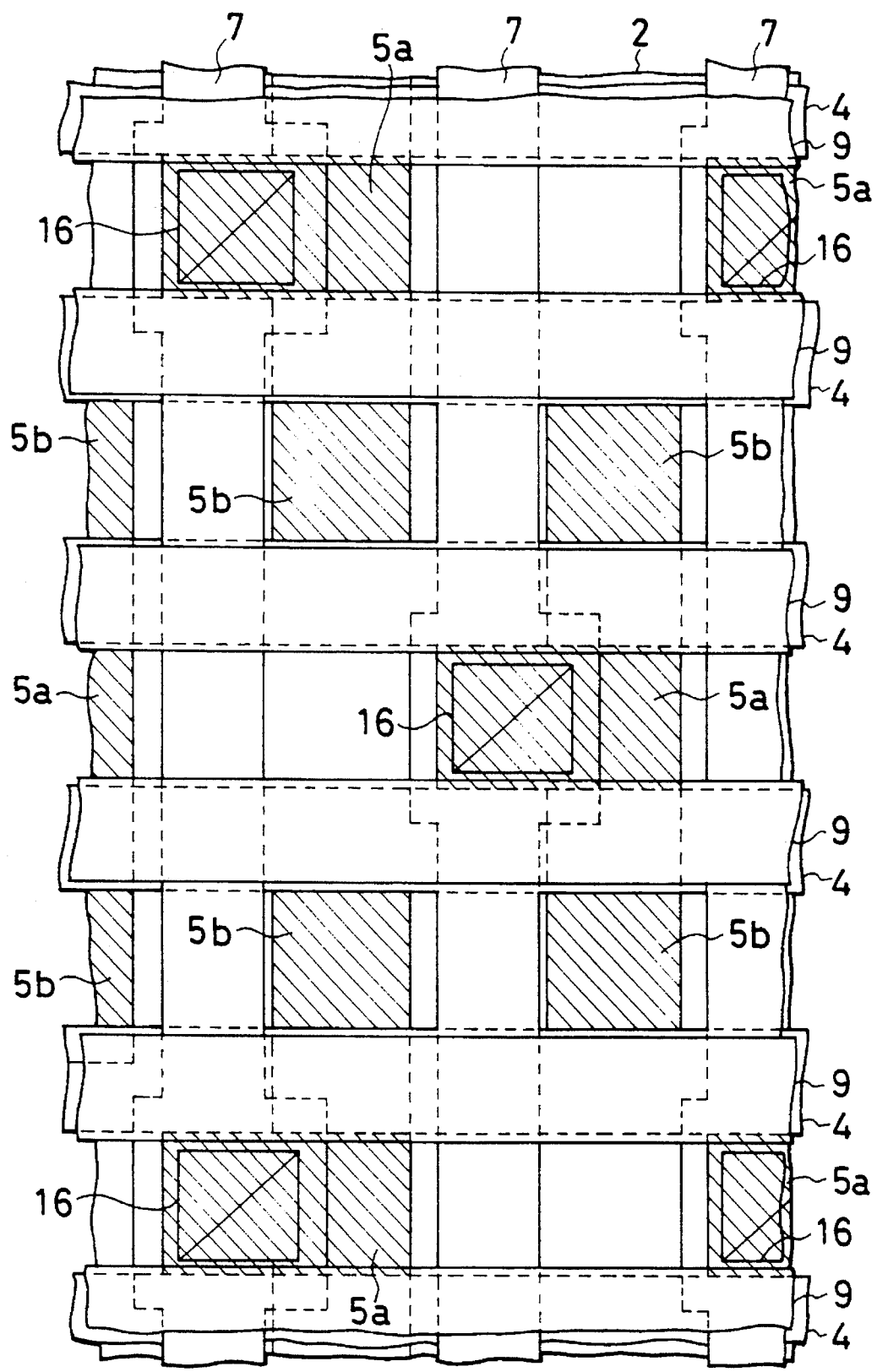

The second interlayer insulator 8 made of a BPSG film or of BPSG and SiO2 films stacked is deposited on the first interlayer insulator 6, and as a result, the bit lines 7 is covered with the insulator 8. Thereafter, the BPSG film is made reflow for its planarization by a heat treatment at a high temperature of 800° to 900° C. Next, as shown in FIG. 7, an aluminum system metal film such as Al-Sl, Al-Sl-Cu or Al-Cu film is deposited by a sputtering technique on the second interlayer insulator 8 and patterned by an etching technique to form the first wiring lines 9.

Figure 8:
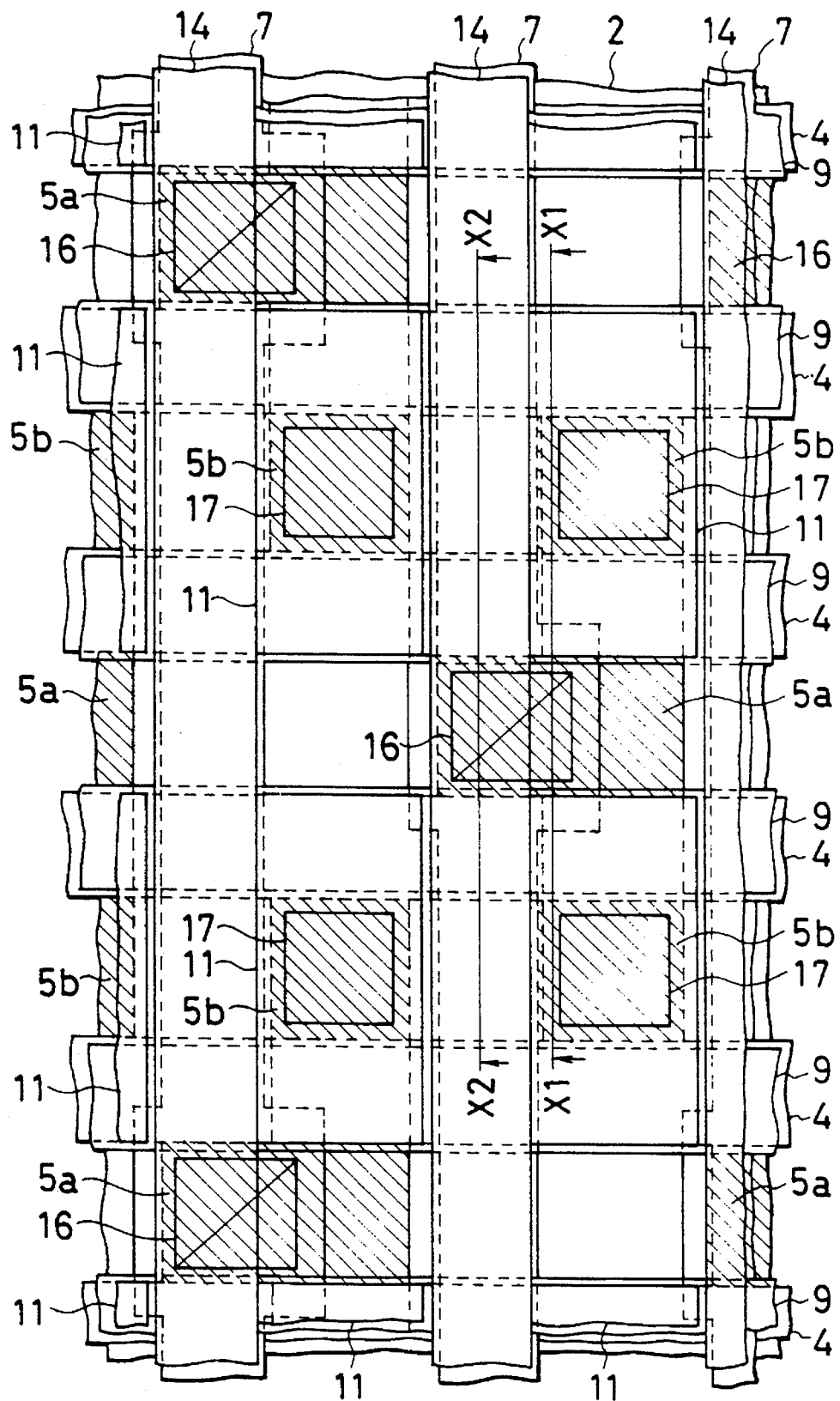
FIG. 8 shows a layout of memory cells of a semiconductor memory according to a second embodiment of the present invention.

An $SiO_2$ film is deposited at a temperature of 400° C. or lower by a plasma-enhanced CVD technique on the second interlayer insulator 8 so as to cover the first wring lines 9 thereby to form the third interlayer insulator 10. Then, as shown in FIG. 8, the contact holes are formed in the first, second and third interlayer insulators 6, 8 and 10 so as to penetrating the insulators 6, 8 and 10 for respectively contacting the storage electrodes 11 with the source/drain regions 5b at the contact areas 17.

Next, on the third interlayer insulator 10, an amorphous silicon is deposited by a CVD technique or a W film is deposited by a Low-Pressure CVD technique, at a temperature of 400° C. or lower, respectively, and patterned by an etching technique to form the dielectrics 12 on the respective storage electrodes 11.

As the dielectric 12 of the storage capacitor, an $Si_3N_4$ film deposited by a plasma-enhanced CVD technique at a low temperature, a $Ta_2O_5$ film deposited by a CVD or sputtering technique, or a PZT film deposited by a sputtering or sol-gel technique may be employed.

A film of refractory metal such as Ti-N, W or the like is deposited on the third interlayer insulator 10 by a LPCVD technique so as to cover the dielectrics 12, and patterned by an etching technique to form the opposite electrodes 13, which is called "cell plates". Thus, the DRAM memory cell array of the first embodiment shown in FIGS. 2 and 3 is finished.

Figure 1:
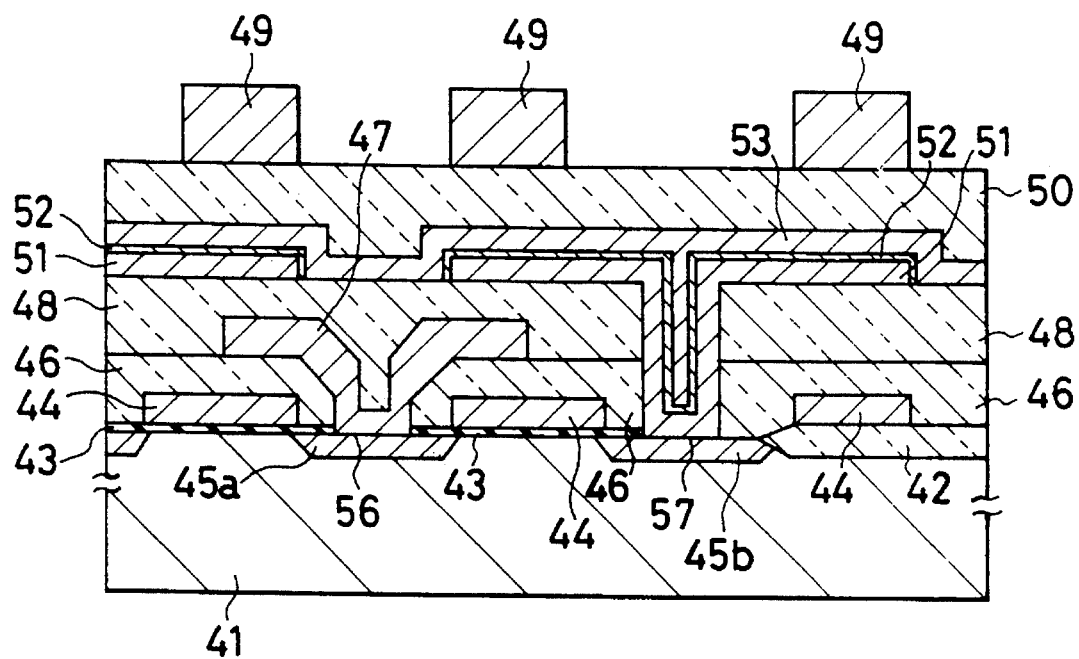
FIG. 1 shows a cross-section of a memory cell of a conventional semiconductor memory.

In the above-described DRAM memory cell, since the storage capacitor composed of the storage electrode 11, the dielectric 12 and the opposite electrode 13 is provided on the third interlayer insulator 10 excepting its part in the contact hole, the first wiring lines 9 is not required to be formed over the storage capacitor as in the conventional DRAM in FIG. 1. Accordingly, the thickness of the storage electrode 11 can be made thicker such as 0.3 to 3 μm, and as a result, sufficient capacitance can be obtained for exactly reading out the data value stored in the memory cell even if the cell area is reduced.

Besides, in the process steps subsequent to that of forming the storage capacitor, there is required for no heat treatment of 400° C. or more at which aluminum system metal wiring lines are normally formed, so that any metal oxide with a large dielectric constant value such as $Ta_2O_5$ or the like, which cannot endure high-temperature heat treatments, can be used as the dielectric 12. As a result, larger capacitance value of the storage capacitor per unit area can be obtained than that in the case using $Si_3N_4$ film as the dielectric 12. This means that the memory cell area can be reduced if the capacitance value of the storage capacitor is made the same as that of the conventional one, which enables higher density of DRAMs.

For example, in 64-Mbit DRAMs, the area of the storage capacitor region is about $0.5 \times 1.4$ μm$^2$. Besides, when the height of the capacitor is 1 μm and a silicon nitride system ($SiN_x$) film whose equivalent thickness $t_{eff}$ to an oxide film is 5 nm is employed as the dielectric, the capacitance value is 31 fF. On the other hand, when a $Ta_2O_5$ film whose equivalent thickness $t_{eff}$ to an oxide film is 3 nm is employed as the dielectric, the capacitance value is 51 fF. It is found that sufficient capacitance values for exactly reading out the stored data value can be obtained in both cases. The $SiN_x$ film whose $t_{eff}$ is 5 nm and the $Ta_2O_5$ film whose $t_{eff}$ is 3 nm have the same thicknesses and show equal leakage current characteristics.

When a $Ta_2O_5$ film is employed, the capacitance value becomes 1.6 times as much as that of a $Si_3N_4$ film, so that the capacitor area can be made ⅝.

Second Embodiment

Figure 9:
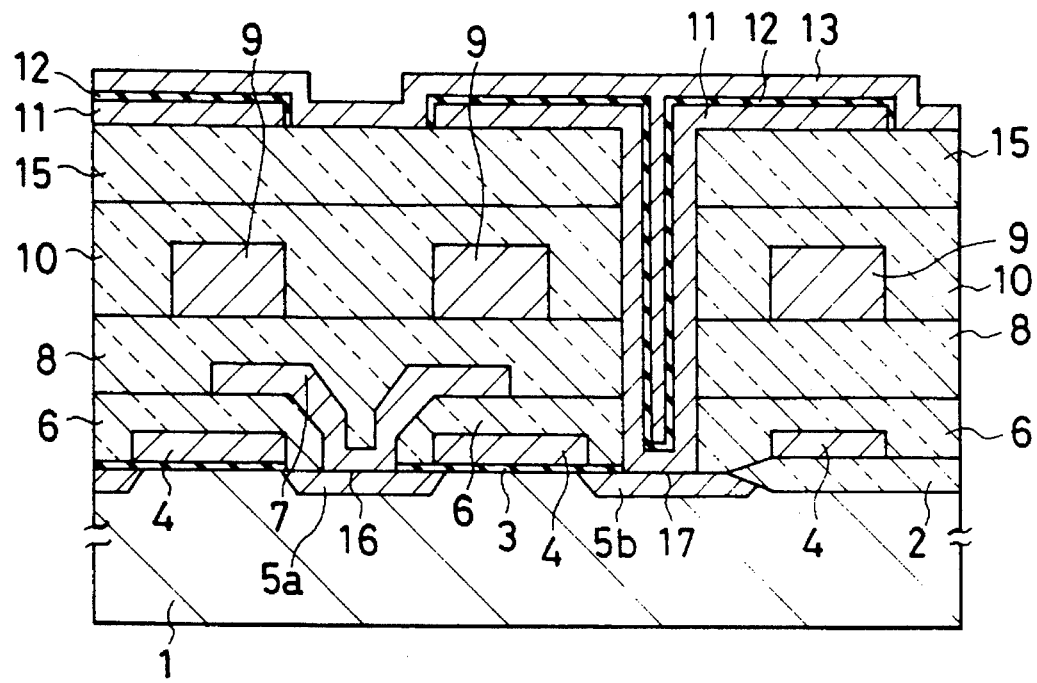
FIG. 9 shows a cross-section along the line X1—X1 in FIG. 8.
Figure 10:
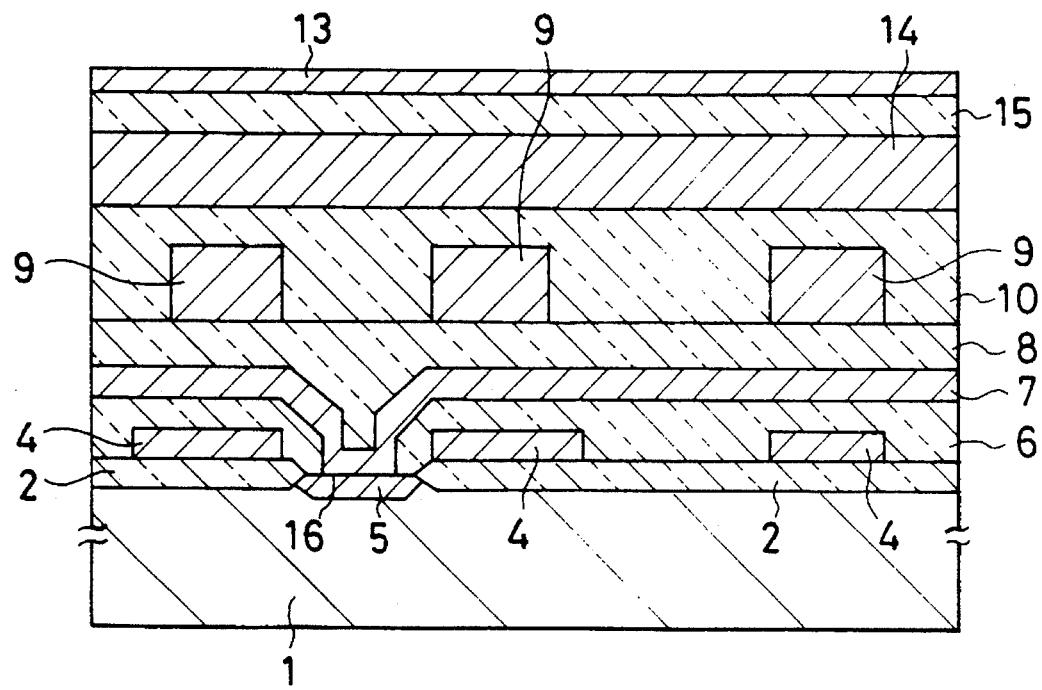
FIG. 10 shows a cross-section along the line X2—X2 in FIG. 8.

FIGS. 8, 9 and 10 show a second embodiment of the present invention. The memory cell of the second embodiment has the same configuration as that of the first embodiment other than that a second wiring line 14 made of an aluminum system metal acting as a selection line of a column decoder and a fourth interlayer insulator 15 are provided. The same reference numerals are attached to corresponding elements to those in the first embodiment.

The second wiring line 14 is formed on the third interlayer insulator 10, and the fourth interlayer insulator 15 is formed on the third interlayer insulator 10 so as to cover the second wiring line 14. The storage electrode 11 is formed on the fourth interlayer insulator 15, and contacted with the source/drain region 5b at the contract area 17 through a contact hole penetrating the first, second third and fourth interlayer insulators 6, 8, 10 and 15.

The DRAM of the second embodiment can be fabricated by almost the same method as above excepting that the processes for forming the second wiring lines 14 and the fourth interlayer insulator 15 are added. That is, after the fourth interlayer insulator 15 is formed on the third interlayer insulator 10 so as to cover the second wiring lines 14, the contact holes penetrating the first, second third and fourth interlayer insulators 6, 8, 10 and 15 are formed, and then the storage electrodes 11, the dielectrics 12 and the opposite electrodes 13 are formed in this order.

In the second embodiment, the same effects as in the first embodiment can be obtained. In addition, an advantage of chip area reduction and access time speed-up can be obtained due to the first and second wiring lines provided in different levels.

What is claimed is:

1. A semiconductor memory containing an array of memory cells, bit lines and word lines, said bit lines and said word lines being electrically connected to said memory cells, respectively, each of said memory cells comprising:

an MOS select transistor having a pair of source/drain regions formed in a semiconductor substrate and a gate electrode formed on a gate insulator on said substrate, said gate electrode acting as a part of one of said word lines;

a first interlayer insulator film formed on said substrate and covering said select transistor, said bit lines being placed on said first interlayer insulator film and one of said bit lines contacting one of said pair of source/drain regions through a first contact hole penetrating said first interlayer insulator film;

a second interlayer insulator film formed on said first interlayer insulator film and covering said bit lines;

a first patterned wiring film formed on said second interlayer insulator film, said first patterned wiring film acting as a part of one of said word lines;

a third interlayer insulator film formed on said second interlayer insulator film and covering said first patterned wiring film;

a first capacitor electrode constituting a storage capacitor, said first capacitor electrode being formed on said third interlayer insulator film and contacting the other of said pair of source/drain regions through a second contact hole penetrating said first, second and third interlayer insulator films;

a capacitor dielectric constituting said storage capacitor, said capacitor dielectric being formed on said first storage electrode and covering an entire surface of said capacitor electrode; and a second capacitor electrode constituting said storage capacitor, said second capacitor electrode being formed on said capacitor dielectric and covering an entire surface of said dielectric;

wherein each of said memory cells further comprises a second patterned wiring film acting as a selection line of a column decoder between said first patterned wiring film and said capacitor storage electrode.

2. A semiconductor memory as claimed in claim 1, wherein a thickness of said first capacitor electrode is not limited by focusing margins of a photolithography process for forming the first patterned wiring film.

3. The semiconductor memory as claimed in claim 1, wherein said storage electrode of each of said memory cells is made of at least one of amorphous silicon and tungsten.

4. The semiconductor memory as claimed in claim 1, wherein said dielectric of said storage capacitor of each of said memory cells is made of metal oxide.

5. The semiconductor memory as claimed in claim 1, wherein said first patterned wiring film is made of aluminum system metal and said dielectric of said storage capacitor is made of one of tantalum oxide and lead zirconate titanate.

6. The semiconductor memory as claimed in claim 1, wherein said first capacitor electrode is from 0.3 to 3 μm in thickness.

7. A semiconductor memory containing an array of memory cells, each of said memory cells comprising:

an MOS select transistor having a pair of source/drain regions and a gate electrode, one of said pair of source/drain regions being electrically connected to one of bit lines and said gate electrode being electrically connected to one of word lines;

a storage capacitor having a first electrode, a second electrode and a dielectric, said dielectric being placed between said first electrode and said second electrode;

the other of said pair of source/drain regions being electrically connected to said first electrode of said storage capacitor; and a first patterned wiring film acting as a part of one of said word lines, said first patterned wiring film being formed over said bit line on a first interlayer insulator, and said storage capacitor being placed over said first patterned wiring film on a second interlayer insulator;

wherein each of said memory cells further comprises a second patterned wiring film acting as a selection line of a column decoder between said first patterned wiring film and said capacitor storage electrode.

8. A semiconductor memory as claimed in claim 7, wherein a thickness of said first electrode of said storage capacitor is not limited by focusing margins of a photolithography process for forming the first patterned wiring film.

9. The semiconductor memory as claimed in claim 7, wherein said storage electrode of each of said memory cells is made of at least one of amorphous silicon and tungsten.

10. The semiconductor memory as claimed in claim 7, wherein said dielectric of said storage capacitor of each of said memory cells is made of metal oxide.

11. A semiconductor memory containing an array of memory cells, bit lines and word lines, said bit lines and said word lines being electrically connected to said memory cells, respectively, each of said memory cells comprising:

an MOS select transistor having a pair of source/drain regions formed in a semiconductor substrate and a gate electrode formed on a gate insulator on said substrate, said gate electrode acting as a part of one of said word lines;

a first interlayer insulator film formed on said substrate and covering said select transistor, said bit lines being placed on said first interlayer insulator film and one of said bit lines contacting one of said pair of source/drain regions through a first contact hole penetrating said first interlayer insulator film;

a second interlayer insulator film formed on said first interlayer insulator film and covering said bit lines;

a first patterned wiring film formed on said second interlayer insulator film, said first patterned wiring film acting as a part of one of said word lines;

a third interlayer insulator film formed on said second interlayer insulator film and covering said first patterned wiring film;

a second patterned wiring film formed on said third interlayer insulator film;

a fourth interlayer insulator film formed on said third interlayer insulator film and covering said second patterned wiring film;

a first capacitor electrode constituting a storage capacitor, said first capacitor electrode being formed on said fourth interlayer insulator film and contacting the other of said pair of source/drain regions through a second contact hole penetrating said first, second, third and fourth interlayer insulator films;

a capacitor dielectric constituting said storage capacitor, said capacitor dielectric being formed on said first storage electrode and covering an entire surface of said capacitor electrode; and a second capacitor electrode constituting said storage capacitor, said second capacitor electrode being formed on said capacitor dielectric and covering an entire surface of said dielectric.

12. The semiconductor memory as claimed in claim 11, wherein at least one of said first and second patterned wiring films are made of aluminum system metal and said dielectric of said storage capacitor is made of one of tantalum oxide and lead zirconate titanate.

13. The semiconductor memory as claimed in claim 11, wherein said first capacitor electrode is from 0.3 to 3 μm in thickness.

* * * * *